United States Patent
Chittipeddi et al.

(10) Patent No.: US 6,384,452 B1
(45) Date of Patent: May 7, 2002

(54) ELECTROSTATIC DISCHARGE PROTECTION DEVICE WITH MONOLITHICALLY FORMED RESISTOR-CAPACITOR PORTION

(75) Inventors: Sailesh Chittipeddi; Yehuda Smooha, both of Allentown, PA (US)

(73) Assignee: Agere Systems Guardian Corp, Orlando, FL (US)

( * ) Notice: Subject to any disclaimer, the term of this patent is extended or adjusted under 35 U.S.C. 154(b) by 0 days.

(21) Appl. No.: 09/617,687

(22) Filed: Jul. 17, 2000

(51) Int. Cl.[7] .............................................. H01L 27/01
(52) U.S. Cl. ........................ 257/347; 257/355; 257/379; 257/360
(58) Field of Search ................................. 257/347, 349, 257/350, 301, 305, 360, 532, 653, 358, 355, 357; 438/311, 386, 238, 155, 243, 244

(56) References Cited

U.S. PATENT DOCUMENTS

| 5,239,440 A | 8/1993 | Merrill ........................ 361/91 |
| 5,618,745 A | 4/1997 | Kita | |
| 5,770,875 A | * 6/1998 | Assaderaghi ................. 257/301 |
| 5,786,616 A | 7/1998 | Fukumoto et al. | |
| 5,828,106 A | 10/1998 | Sato | |
| 6,294,834 B1 | * 9/2001 | Yeh et al. ..................... 257/758 |

FOREIGN PATENT DOCUMENTS

EP  0 813 248 A2  12/1997

OTHER PUBLICATIONS

European Search Report dated Oct. 01, 2001 for European Patent Application EP 01 11 6031.

* cited by examiner

Primary Examiner—Keith Christianson
Assistant Examiner—Yennhu B. Huynh
(74) Attorney, Agent, or Firm—Duane Morris LLP

(57) ABSTRACT

A semiconductor device comprising a silicon-on-insulator (SOI) substrate including a base substrate, an insulator layer, and a silicon layer, a trench capacitor including at least one trench formed in the silicon-on-insulator substrate and extending through the silicon layer and the insulator layer to the base substrate, and a resistive element formed in the silicon-on-insulator substrate. The capacitor and resistor structure provide an R-C circuit which may be used in triggering an electrostatic discharge (ESD) protection device.

13 Claims, 14 Drawing Sheets

ELECTROSTATIC DISCHARGE PROTECTION DEVICE WITH MONOLITHICALLY FORMED RESISTOR-CAPACITOR PORTION

RELATED APPLICATIONS

The present invention is related to commonly-assigned U.S. patent application No. 09/611,907.

FIELD OF THE INVENTION

The present invention relates to electrostatic discharge (ESD) protection devices and methods for forming the same, and in particular, to monolithically formed ESD protection devices and methods of forming the same.

DESCRIPTION OF THE RELATED ART

Integrated circuits (ICs) employing field effect devices, such as for example, Metal-Oxide Semiconductor Field Effect Transistors (MOSFETs), have a history of susceptibility to electrostatic discharge (ESD). Given the decreasing size of circuit features and the improvements constantly being made in process technology ESD has become an important concern for IC manufacturers. Static electricity generated by daily activity alone can destroy or substantially harm many field effect circuits. The circuits most susceptible to damage are usually finished circuits which have been packaged, but not yet installed into a finished product. Once installed, other means can protect the chip from damage.

An electrostatic discharge typically occurs when a circuit is touched by an individual handling the circuit before installation; when a static discharge occurs as the packaged circuit slides on its pins across another surface; or more generally, whenever the circuit is exposed to static electricity.

U.S. Pat. No. 5,239,440 to Merrill discloses a circuit for providing ESD protection, which is incorporated herein by reference. The circuit includes a triggering portion 24 and a clamping portion 26 (See FIG. 1). The triggering portion 24 controls the clamping portion 26, so that the power supply voltage ($V_{cc}$) is shunted to ground whenever and electrostatic discharge 'event' occurs. The triggering portion 24 includes a resistor 34 and a capacitor 36 which set a time constant for the triggering portion 24. The time constant controls the periods when the clamping portion 26 of the circuit is activated.

However, the triggering portion 24 of the Merrill circuit is described as a discrete component circuit which is disposed in proximity to the integrated circuit to be protected. The addition of discrete components to an IC adds significantly to the size of the IC, and since smaller size is almost always desirable, the addition of such components decreases the commercial viability of such an IC.

Therefore, there is currently a need for an ESD protection circuit which is formed monolithically in the surface of the integrated circuit to be protected.

SUMMARY OF THE INVENTION

The present invention is a semiconductor device comprising a silicon-on-insulator substrate including a base substrate, an insulator layer, and a silicon layer, a trench capacitor including at least one trench formed in the silicon-on-insulator substrate and extending through the silicon layer and the insulator layer to the base substrate, and a resistive element formed in the silicon-on-insulator substrate.

The above and other advantages and features of the present invention will be better understood from the following detailed description of the preferred embodiments of the invention which is provided in connection with the accompanying drawings.

BRIEF DESCRIPTION OF THE DRAWINGS

FIG. 1 is a side cross-sectional view showing a silicon-on-insulator (SOI) substrate.

FIG. 2 is a side cross-sectional view showing a silicon-on-insulator substrate showing the formation of a pair of trenches.

FIG. 3 is a side cross-sectional view showing a conductive material being formed in the pair of trenches FIG. 4 is a side cross-sectional view showing the formation of an oxide resistant layer.

FIG. 5 is a side cross-sectional view showing the formation of a masking layer.

FIG. 6 is a side cross-sectional view showing the formation of a second insulator layer.

FIG. 7 is a side cross-sectional view showing the formation of a second masking layer.

FIG. 8 is a side cross-sectional view showing the formation of a second conductive layer.

FIG. 9 is a side cross-sectional view showing ion implantation of the device.

FIG. 10 is a side cross-sectional view showing the device after the masking layer is removed.

FIG. 11 is a side cross-sectional view showing the formation of additional trenches.

FIG. 12 is a side cross-sectional view showing the formation of a third conductive layer in the additional trenches.

FIG. 13 is a side cross-sectional view showing the formation of isolation trenches.

DETAILED DESCRIPTION

Referring to FIGS. 1–13, there is shown a process for forming a triggering circuit device 100 for use with a electrostatic discharge (ESD) protection device according to an exemplary embodiment of the present invention.

Figure 14:
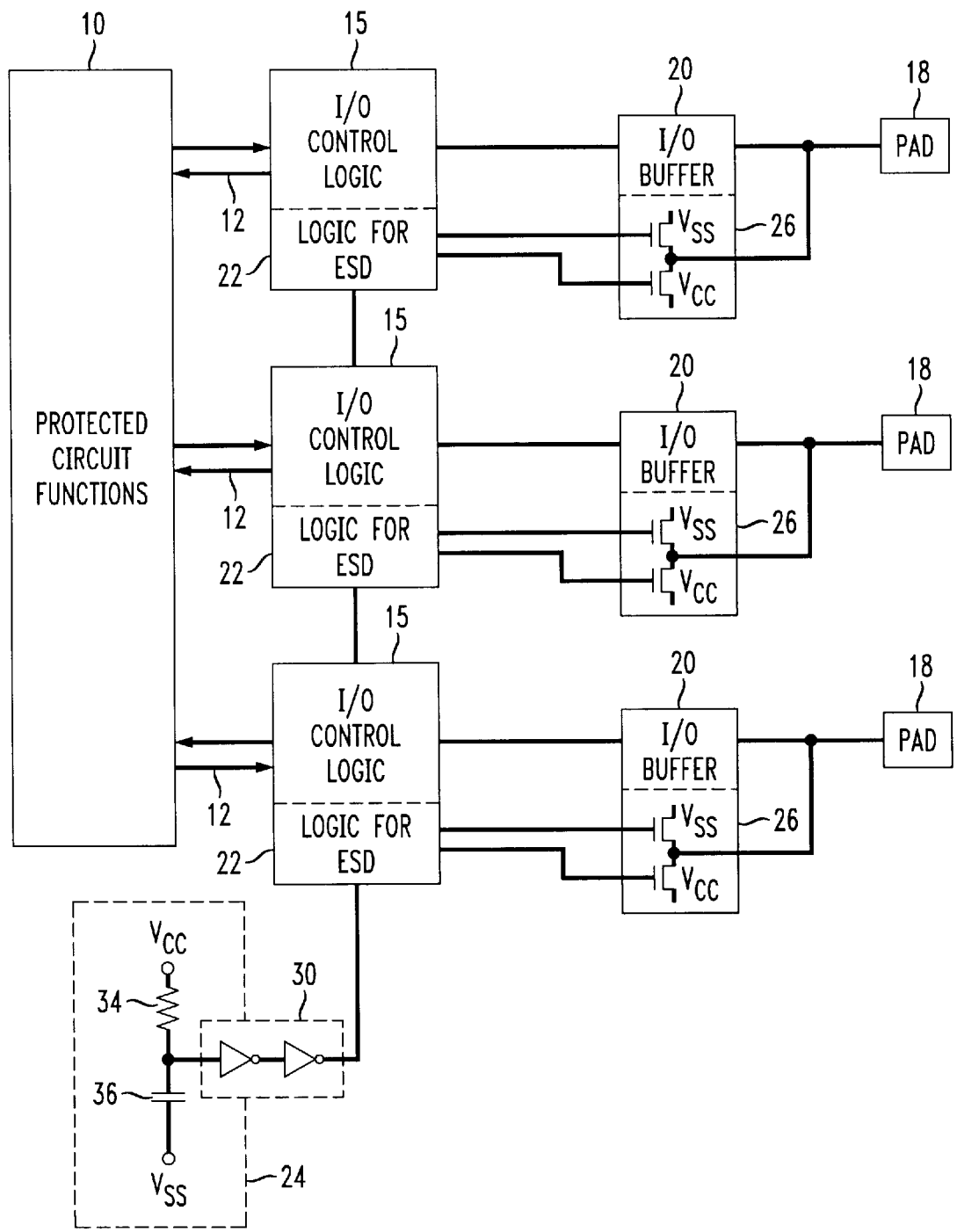
FIG. 14 shows an electrostatic discharge protection circuit.

FIG. 14 shows an electrostatic discharge (ESD) protection circuit which is employed to protect another circuit 10. As shown in FIG. 14, the protected circuit 10 has a series of input/output nodes 12. For simplicity, only three such nodes are shown in the figure; however, it should be understood that in a typical embodiment there may be hundreds of such nodes. The protected circuit can have any function, but typically will be a digital logic circuit such as a gate array or the like. Data, addresses, and other signals destined for the protected circuit 10 are received at bonding pads 18, typically positioned around the periphery of an integrated circuit on which all of the circuitry of FIG. 14 is formed. These signals then are supplied to input/output buffers 20 and to input/output control logic 15 before reaching the protected circuit 10. Of course, in a similar manner, signals originating within the protected circuit, which are destined for circuits outside the integrated circuit being protected, are supplied from the protected circuit 10 through the control logic 15 and buffers 20 to bonding pads 18.

Importantly, in addition to the conventional circuitry described, the circuit shown in FIG. 14 includes some additional logic 22 for controlling or "triggering" the electrostatic discharge protection circuit comprised of triggering circuit 24 and buffer circuit 30. The electrostatic discharge circuit also includes a clamping circuits 26 and a logic circuits 22 which operate to shunt a power supply voltage (Vex) to ground during the occurrence of a electrostatic discharge event.

In essence, the triggering circuit 24 shown in FIG. 14 controls the clamping circuits 26 to short a power supply voltage ($V_{cc}$) to ground ($V_{ss}$), whenever an electrostatic discharge event occurs. By adjusting the values of the resistor 34 and capacitor 36 components of the triggering circuit 24, shorter or longer periods may be employed. In the preferred embodiment, logic circuit 22 is connected through a buffer 30 to the resistor-capacitor circuit 24. Buffer circuit 30 buffers the signal up from the triggering circuit 24 before it is applied to the logic circuit 22. Further, the capacitor 36 of the triggering circuit 24 is connected to $V_{ss}$, while the resistor 34 is connected to $V_{cc}$.

The triggering circuit 24 is preferably set so that the circuit time constant of resistor 34 and capacitor 36 are such that the clamping circuit 26 is on for a period of time in excess of the electrostatic discharge event. A preferred time constant is about one (1) microsecond, because it is large enough to allow the discharge to power the logic circuit and enable the complementary transistors in the clamping circuit 26 to switch, yet it is small enough not to trigger during normal power supply ramp-up.

According to the present invention, the triggering circuit 24 (comprising capacitive (e.g., capacitor 36 above) and resistive (e.g., resistor 34 above) elements) may be formed monolithically in the surface of the protected integrated circuit 10. The process described below for monolithically forming a triggering circuit 24 is described with reference to a silicon-on-insulator (SOI) substrate (of the protected integrated circuit 10), however, it should be noted that the present process is applicable to other substrates (e.g, Metal-on-Metal (MOM) substrates). The triggering circuit will be described below as a capacitor and resistor device 100, which may be formed separately, or in the surface of an integrated circuit (e.g., integrated circuit 10 above).

Figure 1:
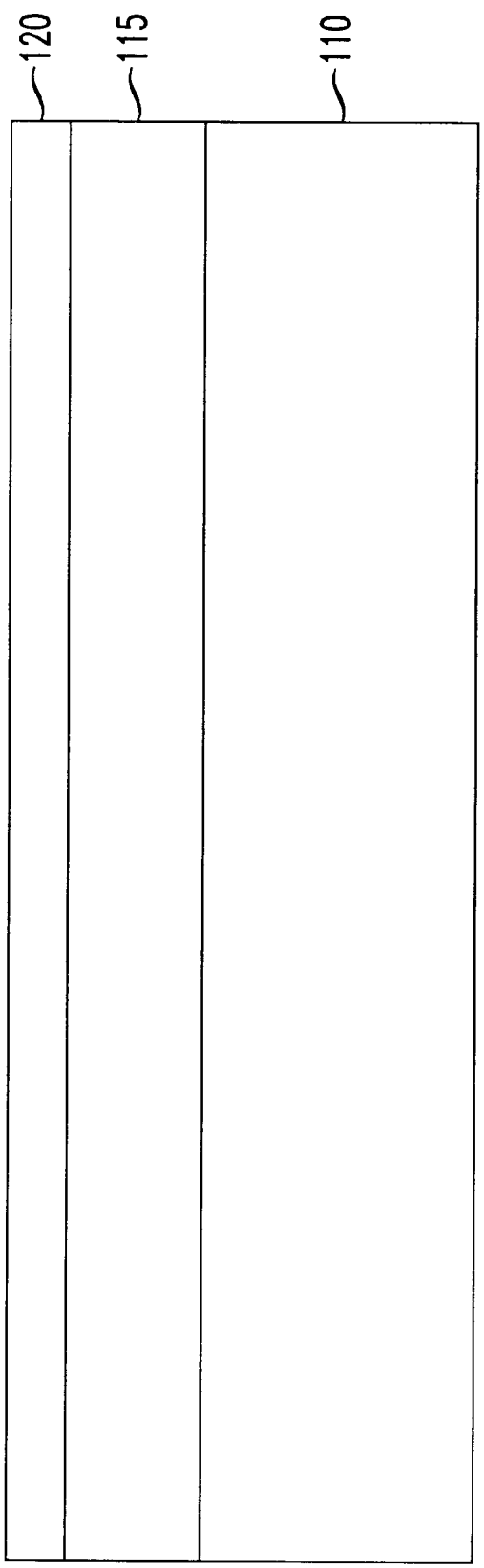
FIGS. 1–13 show a process sequence used to form a capacitor and resistor structure according to an exemplary embodiment of the present invention.

FIG. 1 shows a first step in the production of a capacitor and resistor devices 100, and depicts a silicon-on-insulator (SOI) substrate formed of a semiconductor base substrate layer 110, an insulator layer 115, and a silicon layer 120. The semiconductor base substrate layer 110 may be formed of a silicon (Si) wafer, as is well known in the semiconductor manufacturing industry, however, other materials may also be used for the semiconductor base substrate layer without departing from the scope of the invention. Insulator layer 115 may be formed of silicon dioxide ($SiO_2$), however, other insulators may also be utilized. Silicon layer 120 may be an amorphous silicon layer, or may be a polycrystalline silicon layer (commonly referred to as polysilicon). A thickness of the insulator layer 115 may be in a range 200 angstroms to 6000 angstroms, and a thickness of the silicon layer 120 may be in a range 500 angstroms to 4000 angstroms. However, it should be noted that the above ranges are only suggested dimensions, and that the thicknesses of the insulator layer 115 and silicon layer 120 may be in any suitable range.

Figure 2:
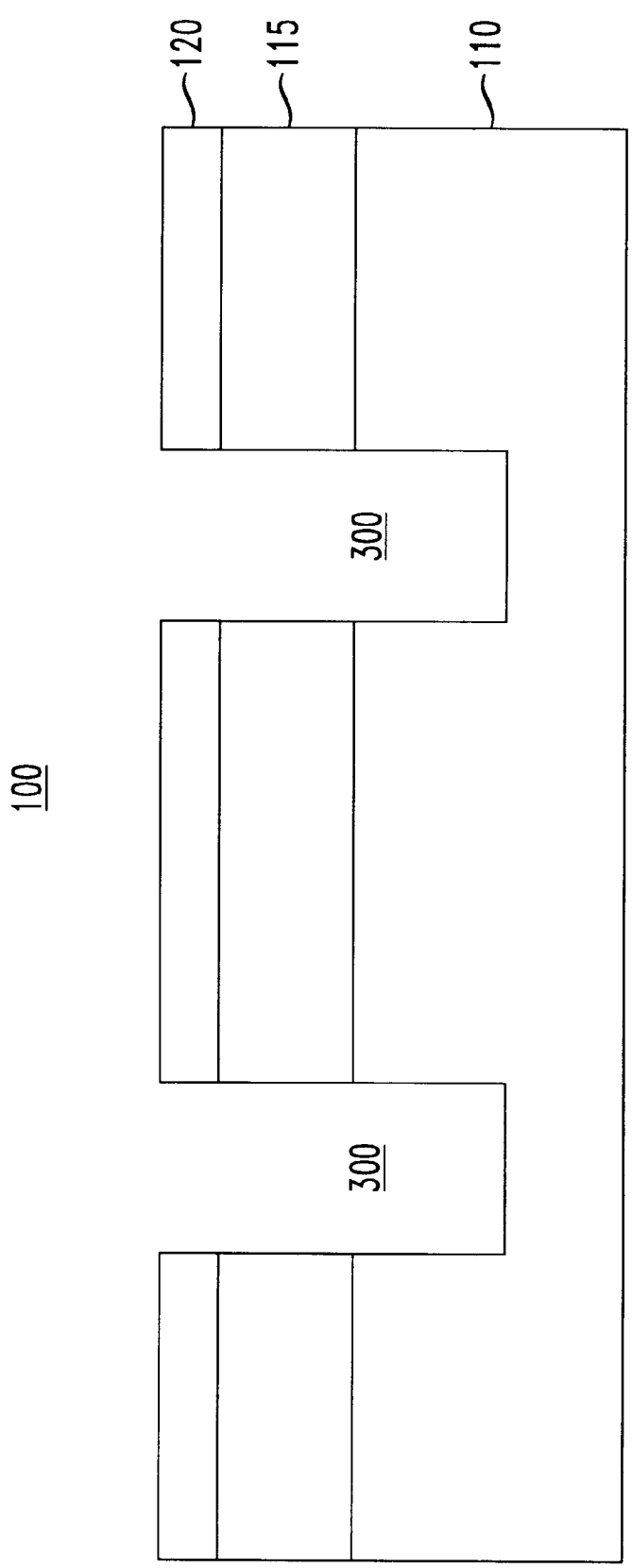
Figure 3:
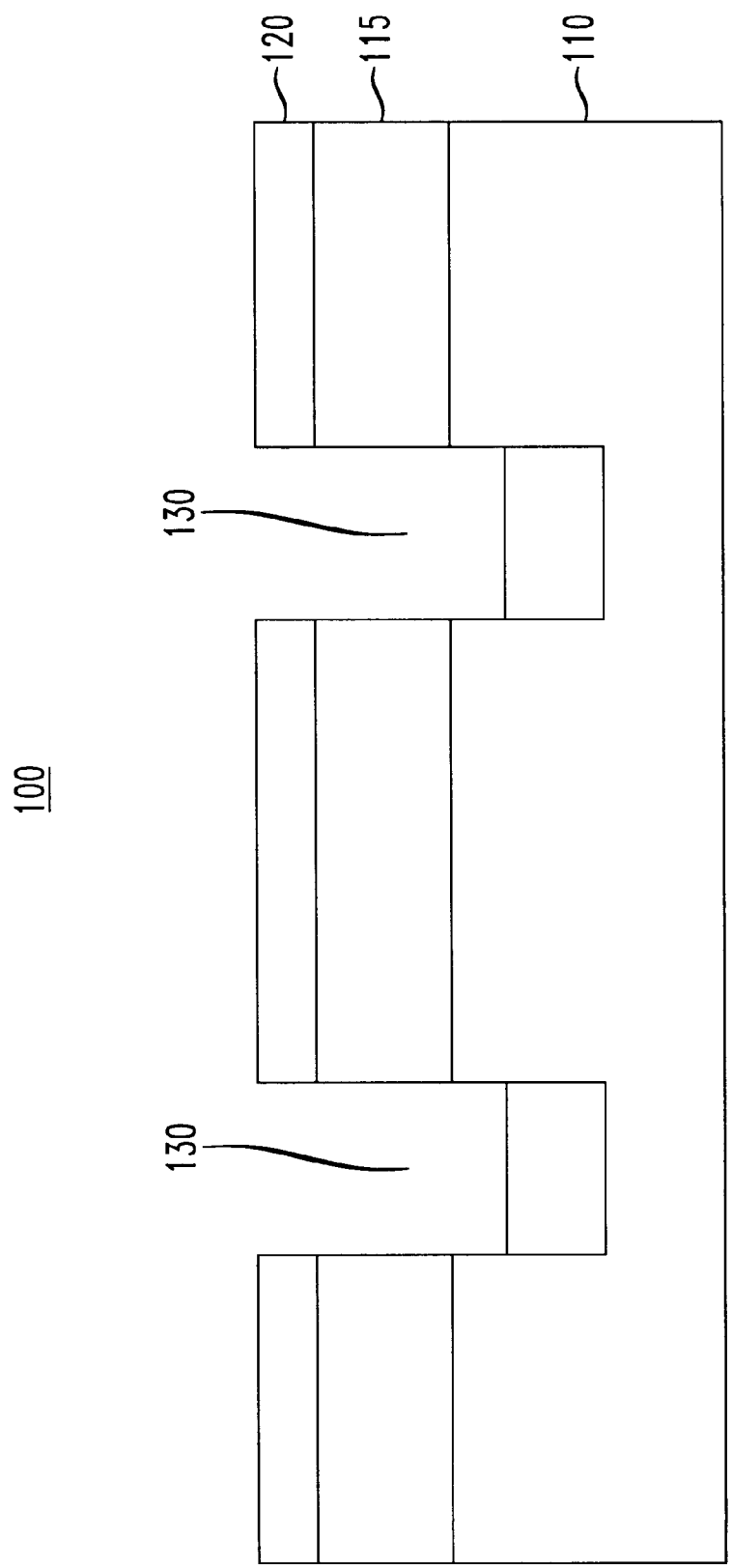

FIG. 2 shows a second step in the process wherein trenches 300, 310 are formed in the SOI substrate. The trenches 300, 310 may be formed by etching and other well known processes. The trenches 300, 310 are used to form separate terminals of a trench capacitor, as explained below. As shown in FIG. 3, the trenches 300, 310 preferably extend at least partially into the base substrate layer 110. The width of the trench 300 preferably varies from 0.1 microns to 2–3 microns, and the depth of the trench preferably varies from 0.5 microns to 6 microns. An "aspect ratio" of the trench 300 is defined as the ratio of the depth to the width, and is preferably less than or equal to 6. Trench 310, may have the same or similar dimensions to that of trench 300, but such a geometry is not required. For simplicity, trenches 300 and 310 are shown as having the same dimensions in the figures. It will be noted that trench 300 forms a trench capacitor and trench 310 forms a contact structure for contacting the base substrate layer 110 of the SOI substrate.

FIG. 3 shows a third step in the process wherein trenches 300, 310 are filled with a conductive material 130, such as silicon (preferably doped polysilicon). The conductive layer 130 may be formed by growing epitaxial silicon on the base substrate layer 120, or by deposition processes well known in the art (e.g., Chemical Vapor Deposition (CVD)).

Figure 4:
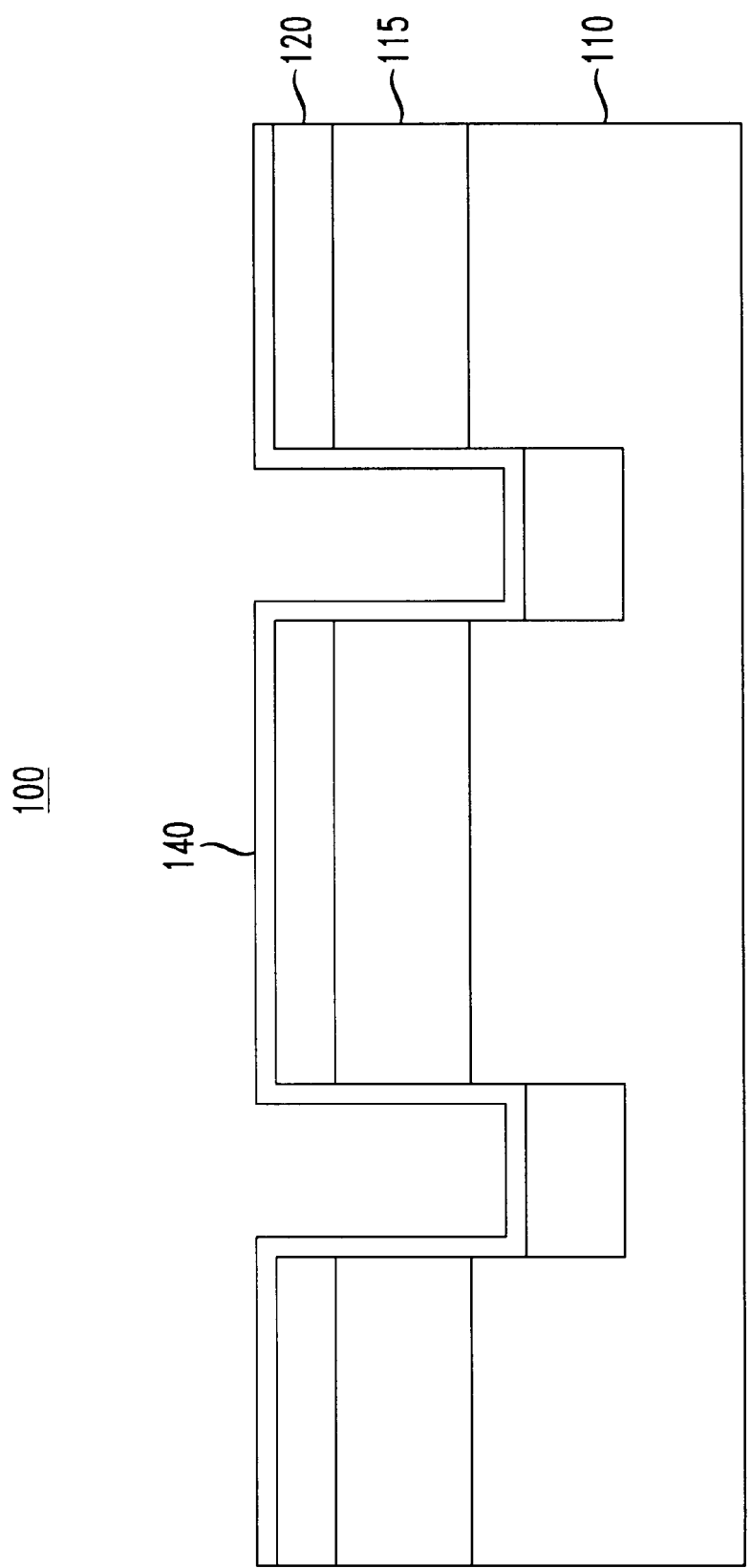

FIG. 4 shows a fourth step in the process wherein an oxide resistant layer 140 is formed on the upper surface of the device 100. The oxide resistant layer 140 may be formed of silicon nitride ($Si_3N_4$), titanium nitride (TiN), tungsten nitride (WN), tantalum nitride (TaN), or any other suitable oxide resistant material. The oxide resistant layer 140 preferably has a thickness in a range from 50 angstroms to 500 angstroms. The oxide resistant layer 140 substantially prevents electrical shorting which may occur between the base substrate layer 110 and the upper silicon layer 120.

Figure 5:
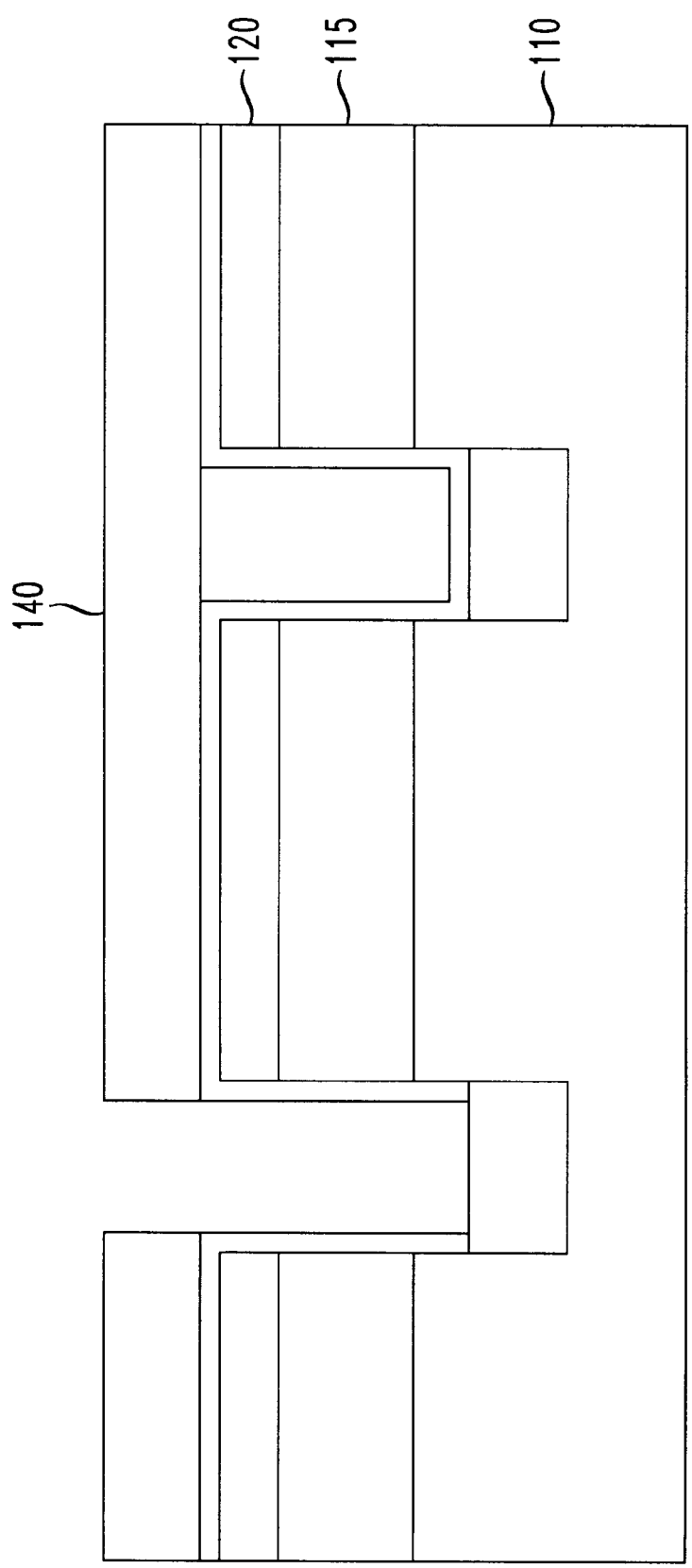

FIG. 5 shows a fifth step in the process wherein a masking film 150 is deposited on specified portions of the upper surface of the device 100. The masking film 150 is preferably formed of a photoresist material, however, other suitable masking films may also be used. In the exemplary embodiment, the masking film 150 covers all portions of the upper surface of the device 100 except trench 300. As shown in FIG. 5, after the masking layer 150 is deposited, it is exposed and the portion of the second oxide resistant layer 140 deposited in the trench 300 is etched away to expose the conductive layer 135 at the bottom of the trench.

Figure 6:
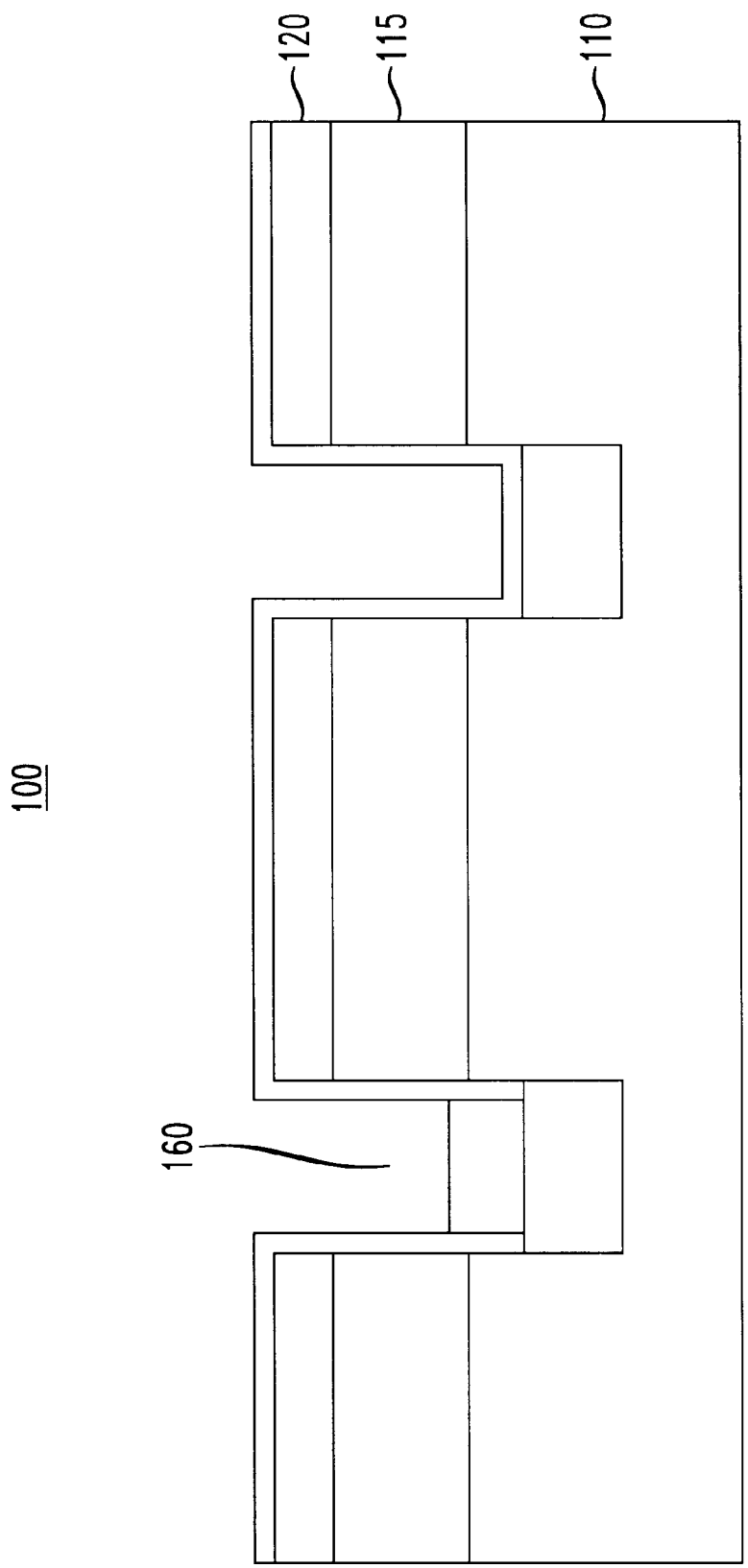

FIG. 6 shows a sixth step in the process wherein a second insulator layer 160 is laid down in the trench 300 on the conductive layer 135. The second insulator layer 160 is preferably formed of silicon dioxide, but may be formed of other suitable insulators. The second insulator layer may be formed by growing silicon dioxide on the conductive layer 135, or by deposition (which would require an additional masking step, as is well known in the art). The second insulator layer 160 preferably has an area in a range from 1 square micron to 500 square microns.

Figure 7:
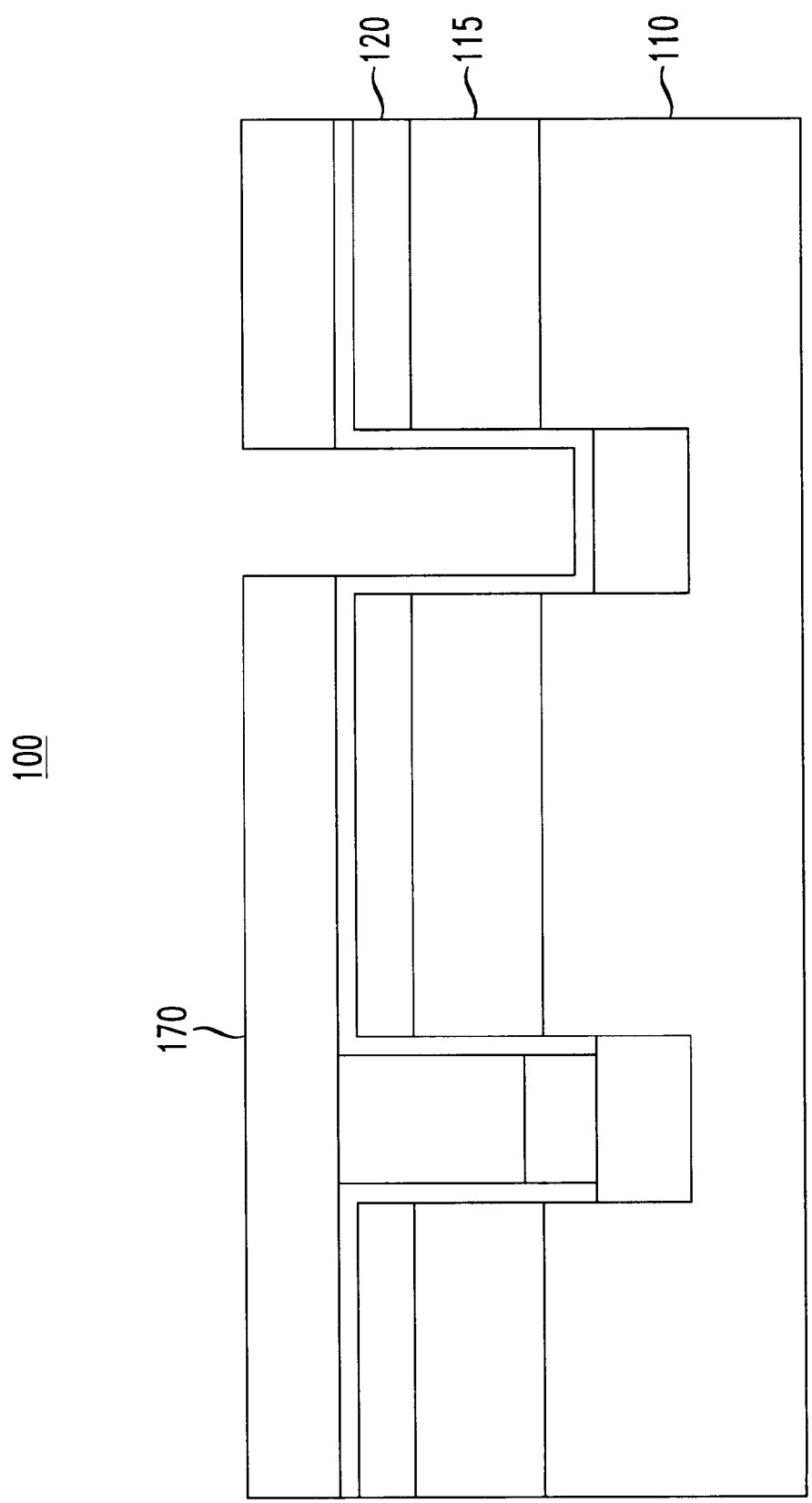

FIG. 7 shows a seventh step in the process wherein portions of the oxide resistant film layer 140 are removed. A second masking layer 170, and an anisotropic etch process are used to remove the second oxide resistant film layer 140 from the bottom of the trench 310, and from the upper surface of the device 100, respectively.

Figure 8:
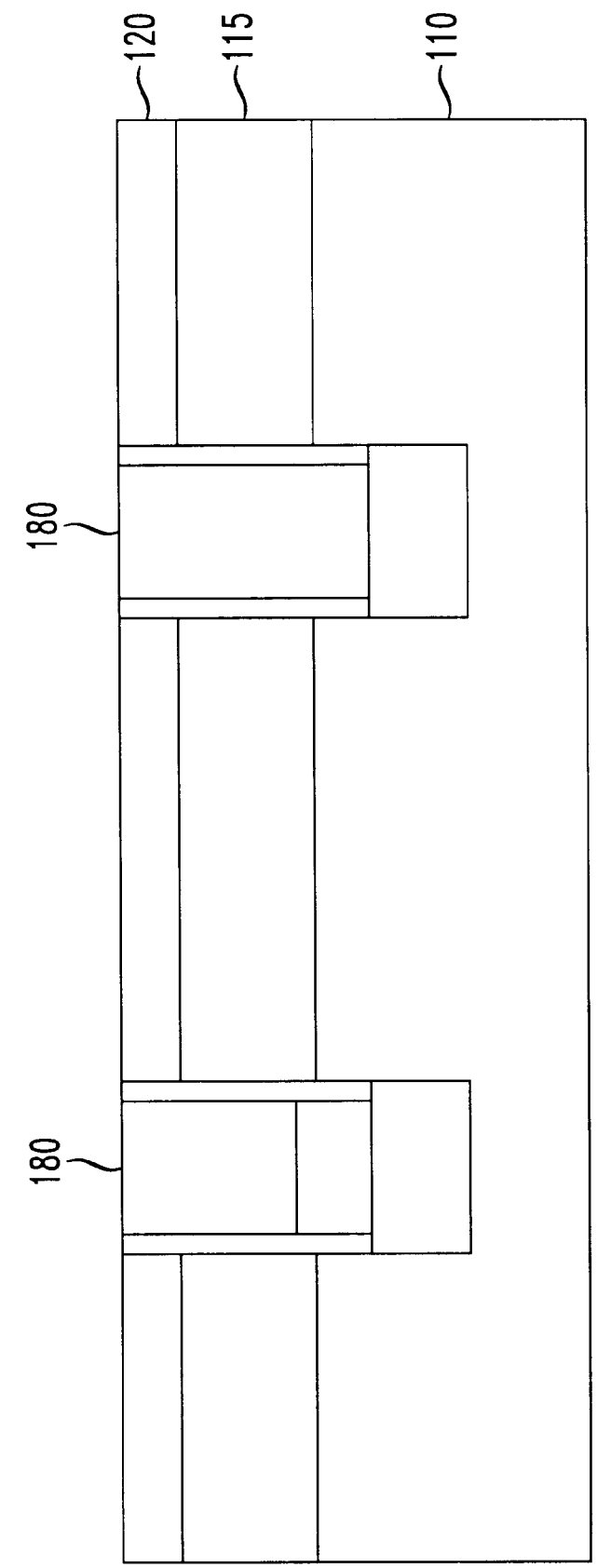

FIG. 8 shows an eighth step in the process wherein a second conductive layer 180 is used to fill both of the trenches 300, 310. The second conductive layer 180 may be formed of silicon, and is preferably formed of polysilicon. First, the second conductive layer 180 is deposited in the trenches 300, 310, and then the upper surface of the device 100 is planarized (using well known techniques such as Chemical Mechanical Polishing (CMP)) to form the device as shown in FIG. 8.

Figure 9:
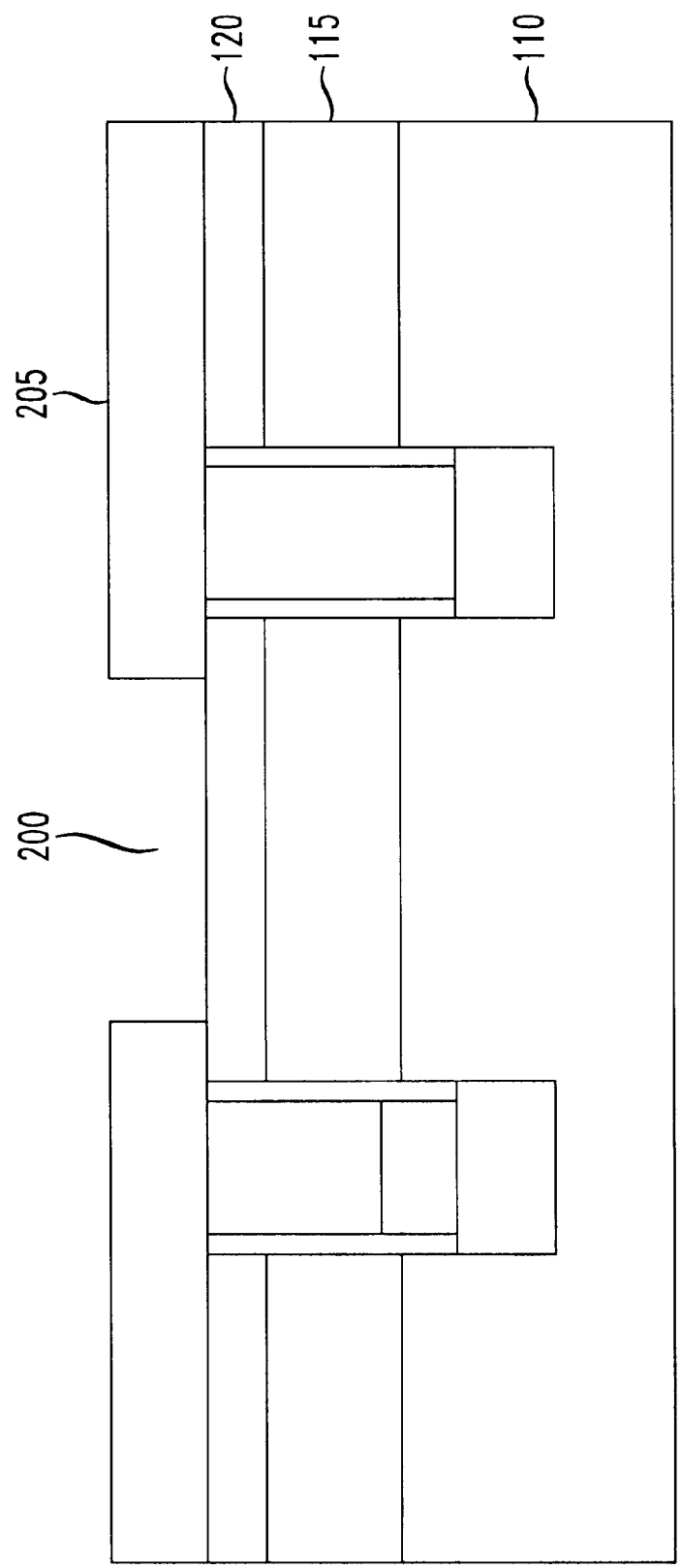

FIG. 9 shows a ninth step in the process wherein the upper surface of the device 100 is covered partially with a masking layer 205, and doping of the device is accomplished through ion implantation. Preferably, ions 200 are implanted in the device 100 to form a n-doped layer (n+) 210 in the semiconductor base substrate layer 110 (See FIG. 10). The n-doped layer 210 is preferably used to form a resistor 34 of the triggering circuit 24 (See FIG. 15).

Figure 10:
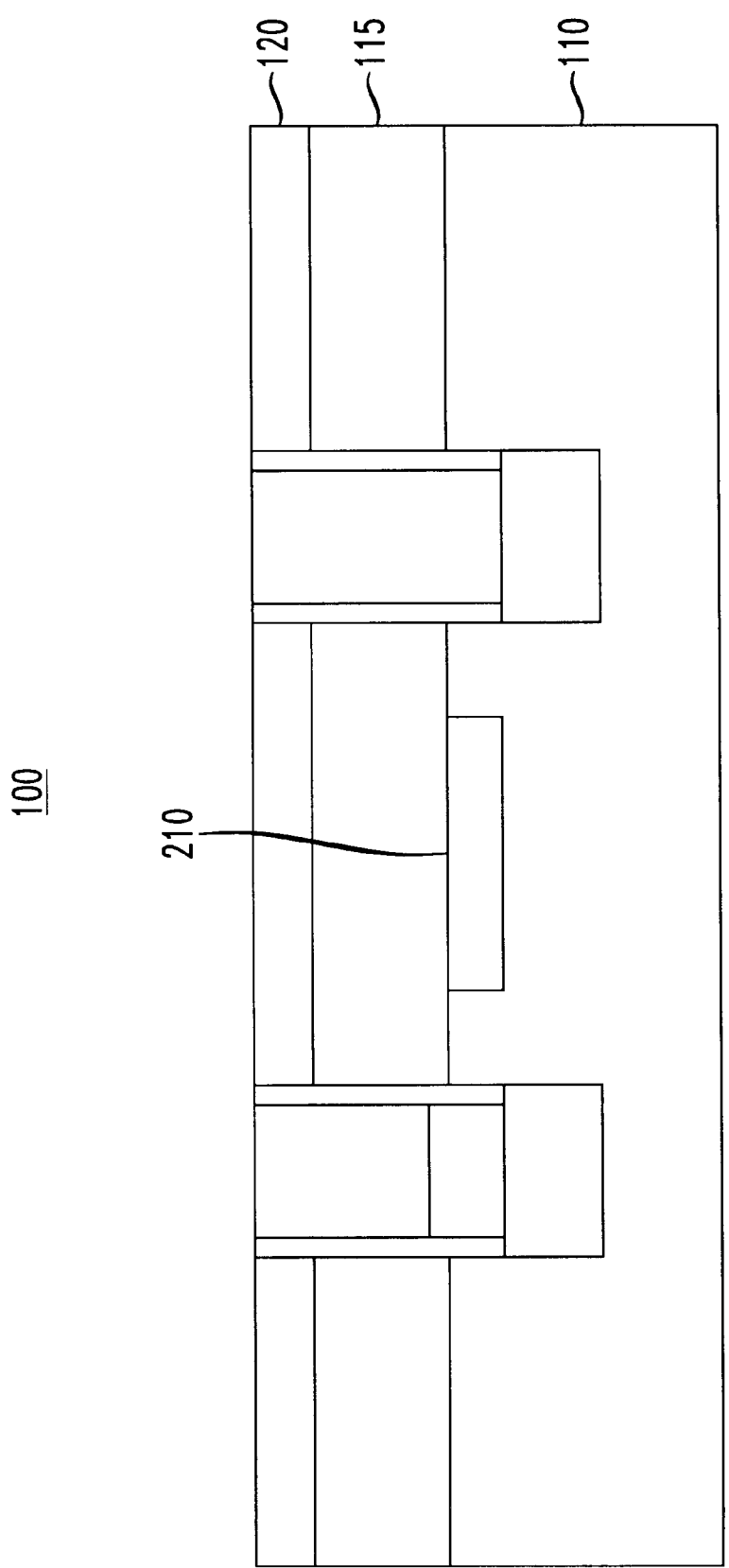

FIG. 10 shows a tenth step in the process wherein the masking layer 205 is removed. At this point, the device 100 appears as shown in FIG. 10, with the n-doped layer 210 disposed in the semiconductor base substrate layer 110. As described above, the n-doped layer 210 forms a resistive element.

Figure 11:
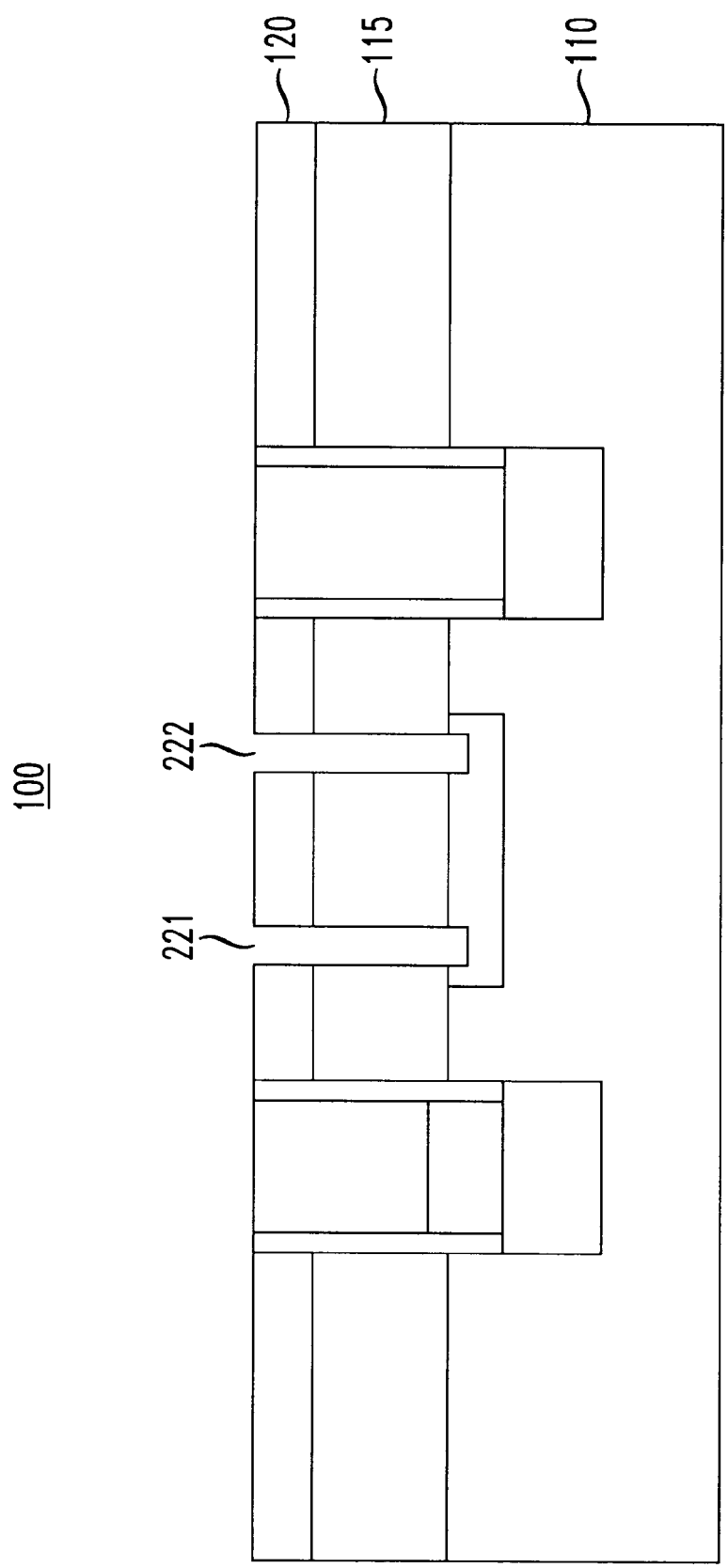

FIG. 11 shows an eleventh step in the process wherein additional trenches 221, 222 are formed in the SOI substrate. In the preferred embodiment, the additional trenches 221, 222 preferably extend to the n-doped layer 210. The trenches 221, 222 may be formed by etching and other well-known processes. The trenches 221, 222 are used to form means for contacting the n-doped layer 210, as explained below. As shown in FIG. 11, the trenches 221, 222 preferably extend through the silicon layer 120, the insulator layer 115 and slightly into the n-doped layer 210, but not into the base substrate layer 110. The trenches 221, 222 may have the same or similar dimensions, but such a geometry is not required. For simplicity, trenches 221, 222 are shown as having the same dimensions in the figures. Both trenches 221, 222 are used to contact the n-doped layer 210.

Figure 12:
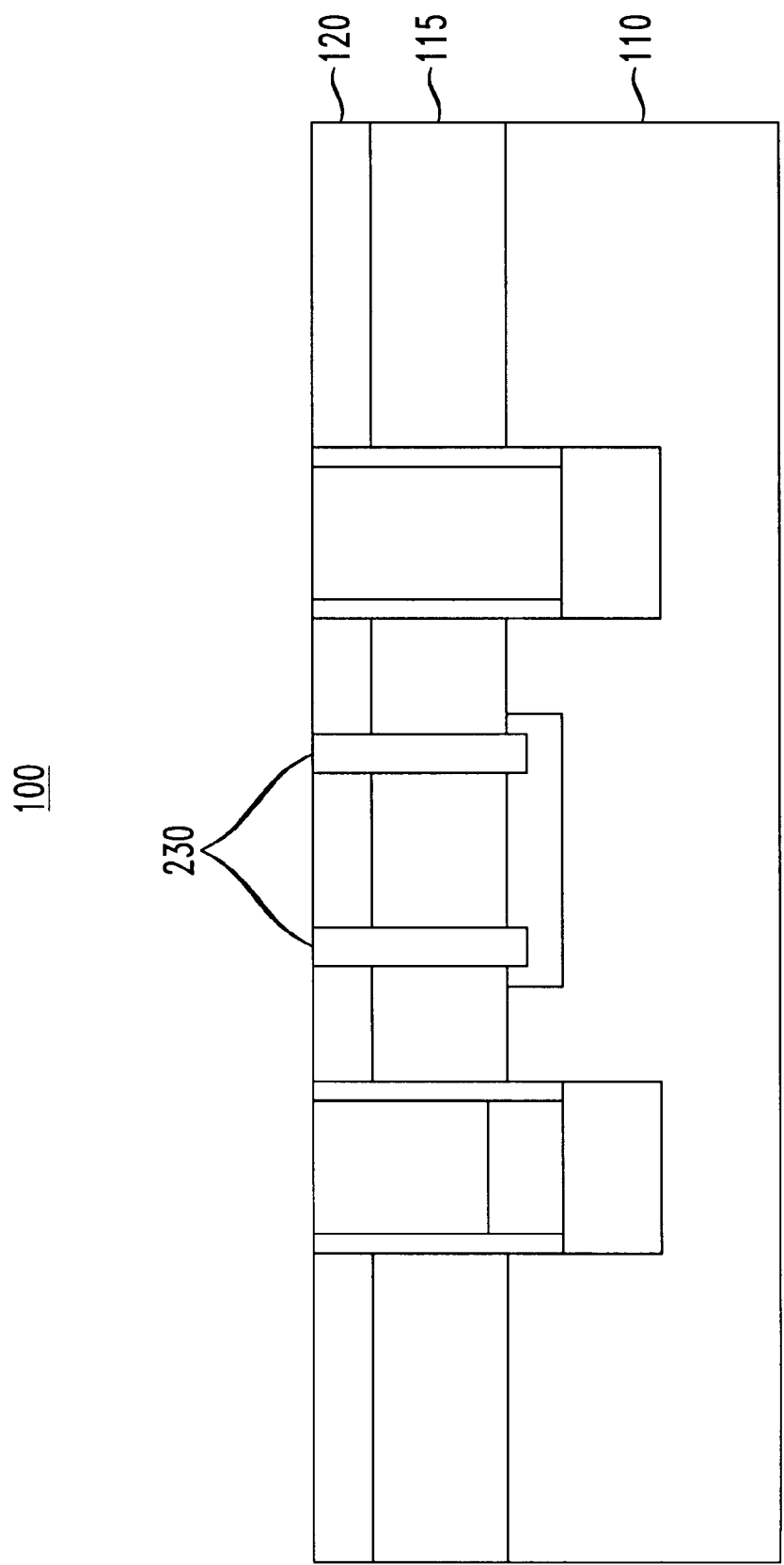

FIG. 12 shows a twelfth step in the process wherein the additional trenches 221, 222 are filled with a third conductive layer 230 (preferably polysilicon). First, the conductive layer 230 is deposited in the trenches 221, 222 and then the upper surface of the device 100 is planarized (using well known techniques such as Chemical Mechanical Polishing (CMP)) to form the device as shown in FIG. 12. Alternatively, trenches 221, 222 can be filled with conducting metal such as Copper (Cu), Aluminum (Al), or the like.

Figure 13:
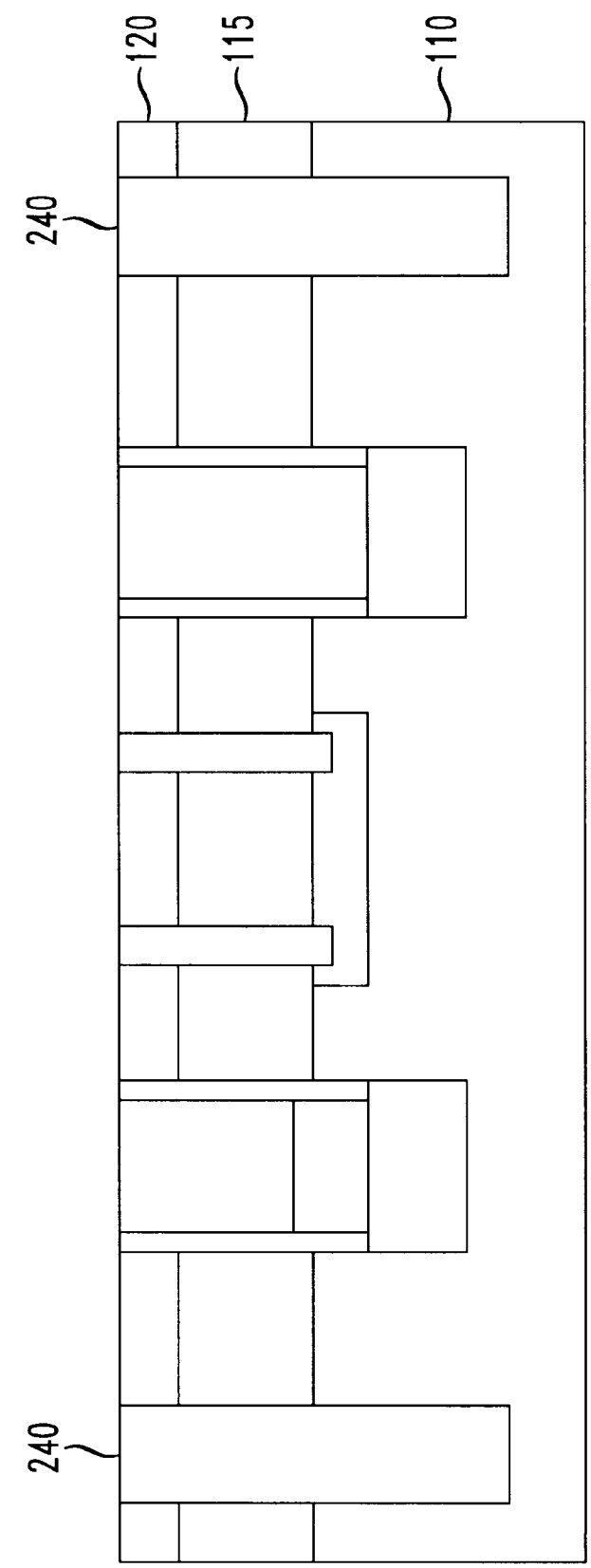

FIG. 13 shows a thirteenth (and final) step in the process wherein isolation trenches 240 are etched and filled with an insulating material. The isolation trenches 240 provide electrical isolation of the device 100 from surrounding electrical elements. The isolation trenches 240 may be formed by etching techniques well known in the art. An insulating material may be formed in the isolation trenches 240 by techniques well known in the art, such as CVD. The insulating material may comprise any suitable insulator, however, $SiO_2$ is preferred.

Thus, the above-described process may be utilized to form a capacitor and resistor device 100 as shown in FIG. 13. The conductive layers 130 and 180 formed in trench 300 form a first electrode of the capacitor, and the portions of the base substrate layer 110 which are adjacent to the trench 300 form a second electrode of the capacitor. Contact to the first electrode may be made via metal land 300 which overlies trench 300, and contact to the second electrode may be made via metal land 300 which overlies trench 310. Similarly, the n-doped layer 210 forms a resistor which is contacted via additional trenches 221, 222.

It is to be emphasized, that an aspect of the present invention is a trench capacitor formed on a SOI substrate and having an electrode (second) formed by regions of the base substrate layer 110 which are adjacent to the trench and which are disposed beneath the insulating layer 115 of the SOI substrate. A further aspect of the present invention is the contact structure (trench 310) formed in close proximity to the trench capacitor, and which extends through the insulating layer 115 of the SOI substrate. Accordingly, the conductive layers 130 and 180 formed in the trench 300 form a first electrode of the semiconductor capacitor, and the portions of the base substrate layer 110 which bound the trench 300 form a second electrode of the semiconductor capacitor which may be contacted via the contact structure formed in trench 310.

Yet another advantage of the present invention is that the uppermost surface of the device 100 is planar, thereby allowing the formation of additional levels on the upper surface of the device without the need for intervening layering steps.

It should be noted that additional levels (dielectrics, conductive contacts) used for contacting the capacitor structures in the trenches 300, 310 and the resistor structure at the base of additional trenches 221, 222 may also be formed on the uppermost surface of the device 100.

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A semiconductor device comprising:
    a silicon-on-insulator substrate including a base substrate, an insulator layer, and a silicon layer;
    a trench capacitor including at least one trench formed in the silicon-on-insulator substrate and extending through the silicon layer and the insulator layer to the base substrate; and,
    a resistive element formed in the silicon-on-insulator substrate,
        wherein the at least one trench includes at least one insulator layer disposed in the at least one trench,
        wherein the trench capacitor includes at least one additional trench which extends through the silicon layer and the insulator layer the base substrate layer, and wherein the at least one additional trench includes a conductive layer disposed therein.

2. The semiconductor device of claim 1, wherein the at least one insulator layer comprises silicon dioxide.

3. The semiconductor device of claim 1, wherein the at least one trench capacitor includes at least one first conductive layer disposed on a first side of the insulator layer and at least one second conductive layer disposed on a second opposing side of the insulator layer.

4. The semiconductor device of claim 3, wherein the at least one first and second conductive layers comprise layers of silicon.

5. The semiconductor device of claim 3, wherein the at least one first and second conductive layers form a first electrode of the trench capacitor.

6. The semiconductor device of claim 5, wherein portions of said base substrate which are adjacent to said at least one trench form a second electrode of said trench capacitor.

7. The semiconductor device of claim 1, wherein the conductive layer comprises silicon.

8. The semiconductor device of claim 1, wherein the at least one additional trench forms a contact structure for contacting the base substrate layer of the silicon-on-insulator substrate.

9. The semiconductor device of claim 1, further comprising:
    at least one first trench formed in the silicon-on-insulator substrate and extending to the resistive element.

10. The semiconductor device of claim 9, wherein the at least one first trench is filled with a conductive material.

11. The semiconductor device of claim 1, further comprising:
   at least one first isolation trench formed in the silicon-on-insulator substrate and extending through the silicon layer and the insulator layer to the base substrate.

12. The semiconductor device of claim 11, wherein the at least one first isolation trench is filled with an insulating material.

13. An electrostatic discharge protection device comprising:
   a silicon-on-insulator substrate including a base substrate, an insulator layer, and a silicon layer;
   a trench capacitor including at least one trench formed in the silicon-on-insulator substrate and extending through the silicon layer and the insulator layer to the base substrate; and, a resistor formed in the silicon-on-insulator substrate, wherein the at least one trench includes at least one insulator layer disposed therein, wherein the trench capacitor includes at least one additional trench which extends through the silicon layer and the insulator layer the base substrate layer, and wherein the at least one additional trench includes a conductive layer disposed therein.

* * * * *